United States Patent
Hu et al.

(10) Patent No.: US 9,054,326 B2
(45) Date of Patent: Jun. 9, 2015

(54) STRUCTURE AND METHOD FOR PACKAGING ORGANIC OPTOELECTRONIC DEVICE

(71) Applicant: WISTRON CORP., New Taipei (TW)

(72) Inventors: Tarng-Shiang Hu, New Taipei (TW); Yi-Kai Wang, New Taipei (TW); Chi-Jen Kao, New Taipei (TW)

(73) Assignee: WISTRON CORP., New Taipei (TW)

( * ) Notice: Subject to any disclaimer, the term of this patent is extended or adjusted under 35 U.S.C. 154(b) by 0 days.

(21) Appl. No.: 14/070,573

(22) Filed: Nov. 3, 2013

(65) Prior Publication Data
US 2014/0339516 A1    Nov. 20, 2014

(30) Foreign Application Priority Data

May 15, 2013    (TW) .............................. 102117236 U

(51) Int. Cl.
| | |
|---|---|
| *H01L 51/44* | (2006.01) |
| *H01L 51/52* | (2006.01) |
| *H01L 51/56* | (2006.01) |
| *H01L 51/10* | (2006.01) |

(52) U.S. Cl.
CPC .............. *H01L 51/448* (2013.01); *H01L 51/56* (2013.01); *H01L 51/107* (2013.01); *H01L 51/5246* (2013.01); *H01L 51/525* (2013.01); *Y02E 10/549* (2013.01)

(58) Field of Classification Search
CPC ... H01L 51/5256; H01L 51/56; H01L 51/448; H01L 51/5237; H01L 51/50; H01L 51/524; H01L 23/13; H01L 23/16; H01L 51/5246; H01L 51/525
USPC ..................... 257/40, 730, E23.002, E23.18
See application file for complete search history.

(56) References Cited

U.S. PATENT DOCUMENTS

| | | | |
|---|---|---|---|
| 6,866,949 B2 | 3/2005 | Ota et al. | |
| 7,649,674 B2 | 1/2010 | Danner et al. | |
| 2005/0285522 A1* | 12/2005 | Han et al. | 313/512 |
| 2007/0211002 A1 | 9/2007 | Zehner et al. | |
| 2010/0231840 A1* | 9/2010 | Saida et al. | 349/153 |
| 2011/0108809 A1* | 5/2011 | Seo et al. | 257/40 |
| 2011/0127548 A1* | 6/2011 | Lee | 257/88 |
| 2011/0163332 A1* | 7/2011 | Ma et al. | 257/88 |

* cited by examiner

*Primary Examiner* — Daniel Whalen
*Assistant Examiner* — Aneta Cieslewicz
(74) *Attorney, Agent, or Firm* — CKC & Partners Co., Ltd.

(57) ABSTRACT

A structure and a method for packaging an organic optoelectronic device are provided. In this method, a first substrate is provided, and a first barrier layer is disposed on the first substrate. An organic optoelectronic device is formed on the first barrier layer, and a first recess is also formed on the first barrier layer, in which the first recess forms a closed loop to surround the organic optoelectronic device. A sealant fills the first recess, and a second barrier layer is disposed on the organic optoelectronic device, in which the sealant attaches the second barrier layer to the first barrier layer to surround the organic optoelectronic device.

7 Claims, 6 Drawing Sheets

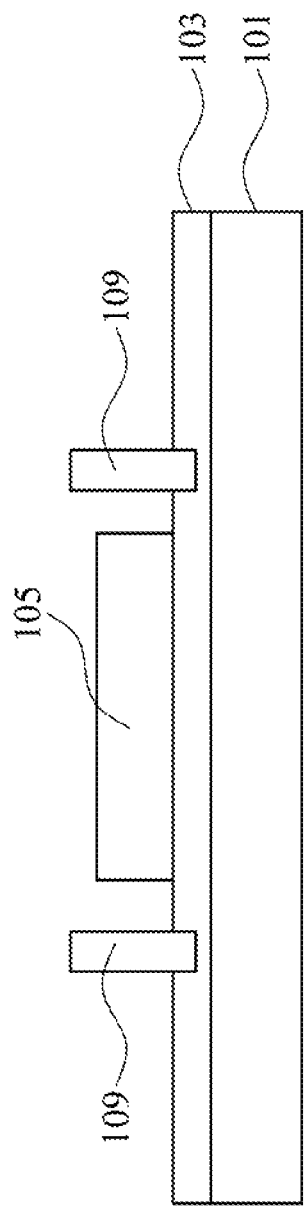
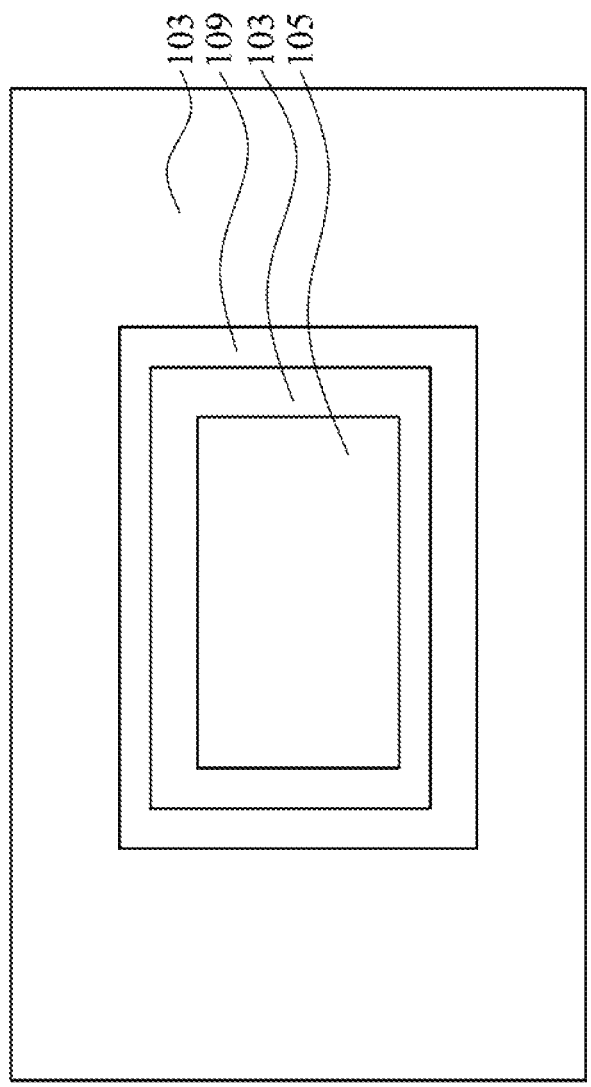

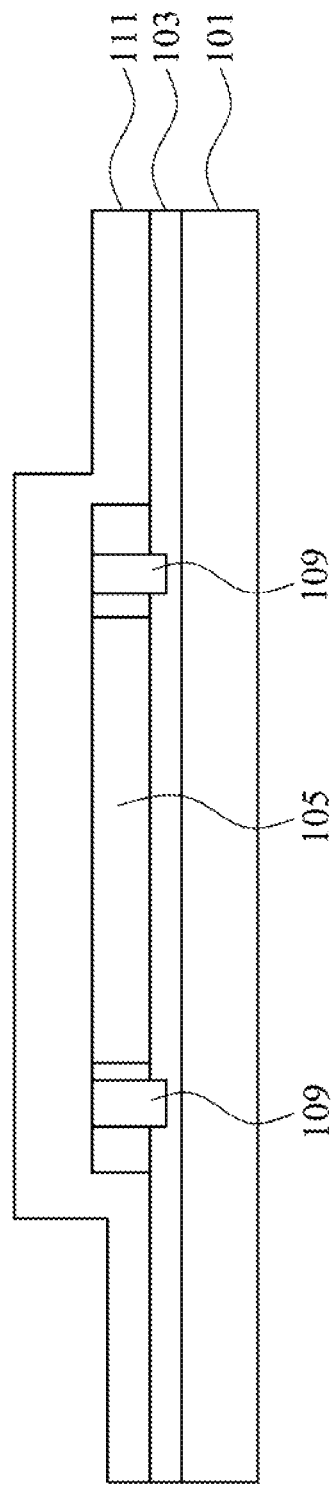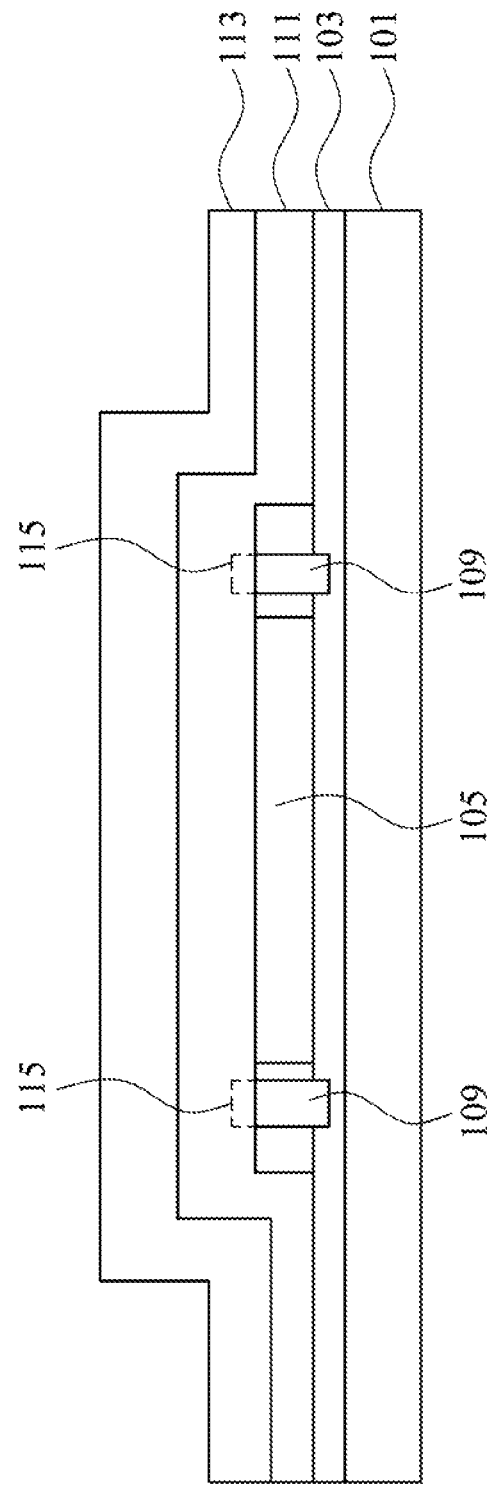

STRUCTURE AND METHOD FOR PACKAGING ORGANIC OPTOELECTRONIC DEVICE

RELATED APPLICATIONS

This application claims priority to Taiwanese Application Serial Number 102117236, filed May 15, 2013, which is herein incorporated by reference.

BACKGROUND

1. Field of Disclosure

The present disclosure relates to a packaging structure. More to particularly, the present disclosure relates to a packaging structure of an organic optoelectronic device.

2. Description of Related Art

As organic optoelectronic devices are developed rapidly in recent years, their corresponding performance and process are improved significantly, and their applications become broader and broader. The organic optoelectronic devices mainly include an organic solar cell (Organic Photovoltaic; OPV) and an organic light emitting diode display (OLED). After having breakthrough performance, the organic optoelectronic devices face commercialization challenges to be overcome. One of the most critical problems for commercialization of the organic optoelectronics is how to prolong component life. Most of the materials used in the organic optoelectronic devices are highly unstable, and will be deteriorated rapidly when contacting moisture and oxygen in the atmosphere. The reason for such deterioration is that most of the organic optoelectronic materials have the conjugated structures of low energy band gaps, and thus the materials are easily excited by irradiation or heat to generate oxidation reaction with oxygen and water molecules in the environment. Meanwhile, the low energy band gap organic optoelectronic materials usually have relatively high occupied molecular orbital, and may easily have oxidation reaction with oxygen even if being at an un-excited ground state, and thus losing the optoelectronic features. In addition to the instability, the organic optoelectronic devices mostly use low work function metals as the electrodes, such as calcium, barium, magnesium, etc. The low work function metals all have strong reducibility and will have severe oxidation reaction even with a tiny amount of water or oxygen, thus deteriorating the devices rapidly. Therefore, a packaging technique is needed for blocking the organic optoelectronic devices from water and oxygen, prolonging the operation life of the organic optoelectronic devices.

SUMMARY

According to one embodiment of the present disclosure, a method for packaging an organic optoelectronic device is disclosed. In the method, a first substrate is provided, and a first barrier layer is disposed on the first substrate. An organic optoelectronic device is formed on the first barrier layer, and a first recess is also formed on the first barrier layer, in which the first recess forms a closed loop to surround the organic optoelectronic device. A sealant fills the first recess, and a second barrier layer is disposed on the organic optoelectronic device, in which the sealant attaches the second barrier layer to the first barrier layer to surround the organic optoelectronic device.

According to another embodiment of the present disclosure, a packaging structure of an organic optoelectronic device is disclosed. The packaging structure includes a first substrate, a first barrier layer, an organic optoelectronic device, a first recess, a second barrier layer, and a sealant. The first barrier layer is disposed on the first substrate, and the organic optoelectronic device is disposed on the first barrier layer. The first recess forms a recessed closed loop on the first barrier layer to surround the organic optoelectronic device. The second barrier layer is disposed on the organic optoelectronic device, and the sealant fills the first recess to attach the second barrier layer to the first barrier layer, in which the sealant also surrounds the organic optoelectronic device.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows:

FIG. 1A to FIG. 1E and FIG. 1G to FIG. 1H are cross sectional diagrams of intermediate stages during a manufacturing process of a packaging structure of an organic optoelectronic device according to one embodiment of the present disclosure;

FIG. 1F is a top view of a packaging structure of an organic optoelectronic device during the manufacturing process according to one embodiment of the present disclosure;

DETAILED DESCRIPTION

Figure 1A:
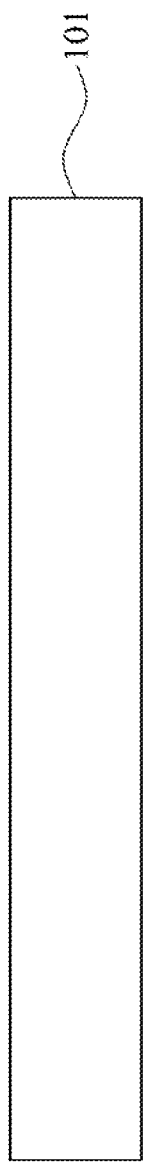
Figure 1B:
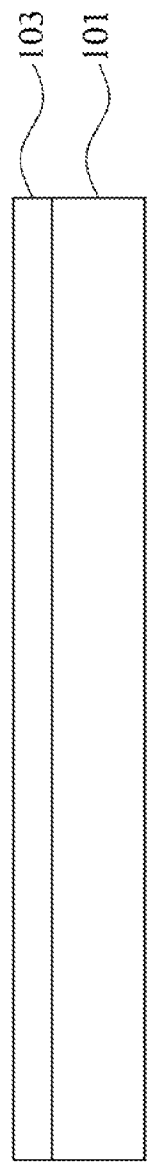

Reference will now be made in detail to the present embodiments of the disclosure, examples of which are illustrated in the accompanying drawings. Wherever possible, the same reference numbers are used in the drawings and the description to refer to the same or like parts.

A structure and a method for packaging an organic optoelectronic device in the following embodiments utilize recesses and a sealant therein to surround the organic optoelectronic device to block the moisture and oxygen out, thus effectively prevents moisture and oxygen permeation and preventing the organic optoelectronic device from being damaged by moisture or oxygen. In addition, the packaging structure is particularly effective for preventing the moisture and oxygen from entering the organic optoelectronic device from its edges/sides, and has good flexibility and is not easy to crack, and thus is suitable for use in a flexible organic optoelectronic device and a flexible display.

FIG. 1A to FIG. 1E and FIG. 1G to FIG. 1H are cross sectional diagrams of intermediate stages during a manufacturing process of a packaging structure of an organic optoelectronic device according to one embodiment of the present disclosure. In the manufacturing process of the packaging structure of the organic optoelectronic device, a first substrate 101 is provided (FIG. 1A), in which the first substrate 101 can be made of glass, metal, or plastic and is applicable to rigid (non-flexible) products. Alternatively, the first substrate 101 can also be made of organic polymer materials or polyimide to be applied to flexible products. Next, a first barrier layer 103 is disposed on the first substrate 101 (FIG. 1B), in which the first barrier layer 103 can be made of an organic material, an inorganic material, a combination of organic and inorganic materials, or an alternately-stacked material. For example, polyethylene terephthalate can be used to form the first barrier layer 103.

Figure 1C:
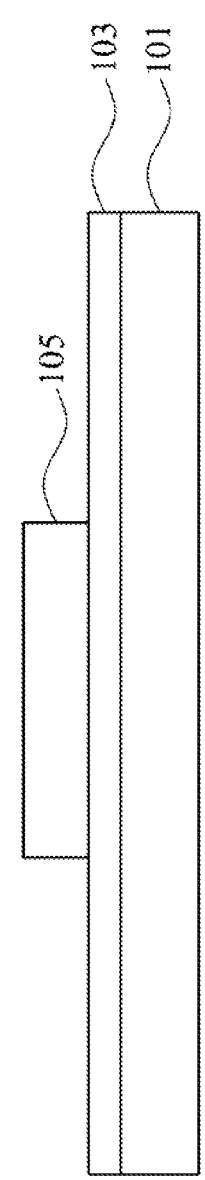

An organic optoelectronic device 105, such as an organic thin film transistor (OTFT), an organic light emitting diode (OLED), an organic photovoltaics (OPV), or an internal element of an electro-phoretic display (EPD) (Electrophoresis), is subsequently formed on the first barrier layer 103 (FIG. 1C).

Figure 1D:
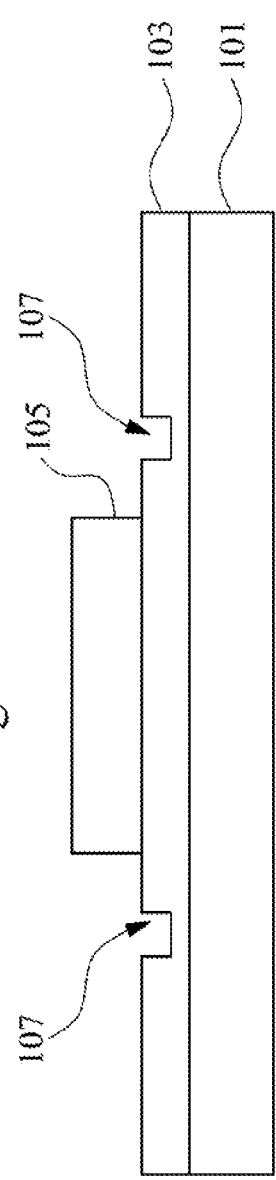

A first recess 107 is formed on the first barrier layer 103 (FIG. 1D). Specifically, the first barrier layer 103 is etched to form the first recess 107 which forms a closed loop surrounding the organic optoelectronic device 105. In this embodiment, there is a gap between the first recess 107 and the organic optoelectronic device 105, which means that the first recess 107 is not close to the organic optoelectronic device 105. The cross section of the first recess 107 can be half circular, elliptical, or rectangular. The size of the first recess 107 is determined in accordance with requirements, and the depth of the first recess 107 is substantially less then the thickness of the first barrier layer 103, which means that the first recess 107 does not penetrate the first barrier layer 103.

After the first recess 107 is formed, a sealant 109 fills in the first recess 107 (FIG. 1E). The coated sealant 109 can be slightly higher than the organic optoelectronic device 105. The sealant 109 can be made of a UV resin or a thermal curable resin in accordance with the requirements of the organic optoelectronic device 105. The water vapor transmission rate of the organic optoelectronic device 105 normally ranges from $10^{-3}$ g/day-m$^2$ to $10^{-6}$ g/day-m$^2$. If the requirement for the water vapor transmission rate is higher, more amount of inorganic material is mixed in the sealant 109; otherwise, less amount of inorganic material is needed. The sealant 109 may be harden through gradual polymerization, certain compound is induced by a free radical for bridging reaction when irradiated by UV, and the sealant 109 is heated for hardening and polymerization reactions.

FIG. 1F is a top view of a packaging structure of an organic optoelectronic device after filling the sealant 109. The layers, from inner to outer in FIG. 1F, are the organic optoelectronic device 105, the first barrier layer 103, the sealant 109, and the first barrier layer 103. As shown in FIG. 1F, the sealant 109 forms a closed loop to surround the organic optoelectronic device 105 for preventing the moisture and the oxygen from permeating into the package structure to damage the organic optoelectronic device 105.

After filling the sealant 109, a second barrier layer 111 is disposed on the organic optoelectronic device 105, and the sealant 109 attaches the second barrier layer 111 to the first barrier layer 103 to surround the organic optoelectronic device 105 (FIG. 1G). Specifically, the second barrier layer 111 can be disposed alone; alternatively, the second barrier layer 111 can also be disposed on a second substrate 113 at first, and the second substrate 113 with the second barrier layer 111 is subsequently press-bonded onto the organic optoelectronic device 105 (FIG. 1H). In addition, a second recess 115, aligned to the first recess 107, can be alternatively formed on the second barrier layer 111, in which the sealant 109 fills the first recess 107 and the corresponding second recess. Therefore, the sealant 109, the first barrier layer 103, and the second barrier layer 111 form a closed space to receive and cover the organic optoelectronic device 105, thereby preventing the organic optoelectronic device 105 from contacting outside moisture and oxygen.

The first substrate 101, the second substrate 113, the first barrier layer 103, and the second barrier layer 111 are made of an organic material, an inorganic material, or an organic and inorganic composite material. The first substrate 101 and the second substrate 113 can also be made of metal, glass, or flexible material.

Figure 2A:
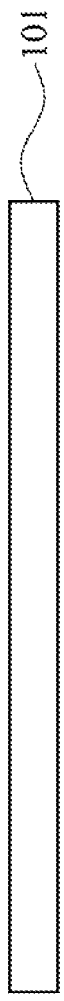
FIG. 2A to FIG. 2E and FIG. 2G to FIG. 2H are cross sectional diagrams of intermediate stages during a manufacturing process of a packaging structure of an organic optoelectronic device during the manufacturing process according to another embodiment of the present disclosure.
Figure 2B:
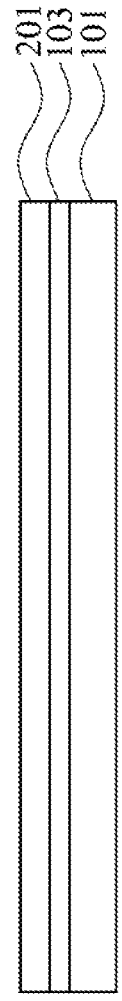
Figure 2C:
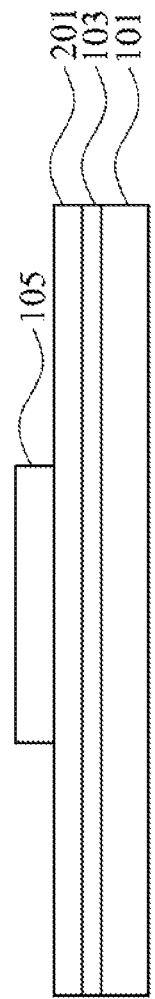
Figure 2D:
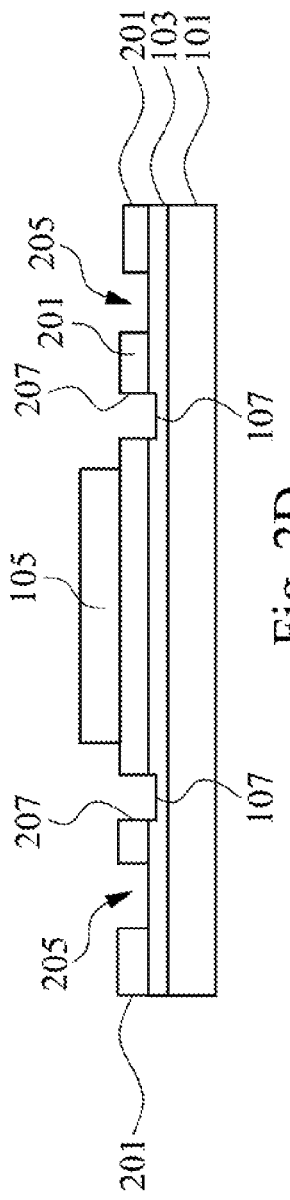
Figure 2E:
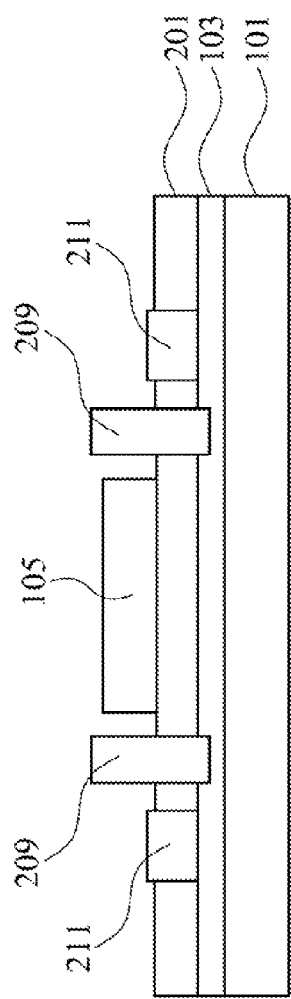
Figure 2F:
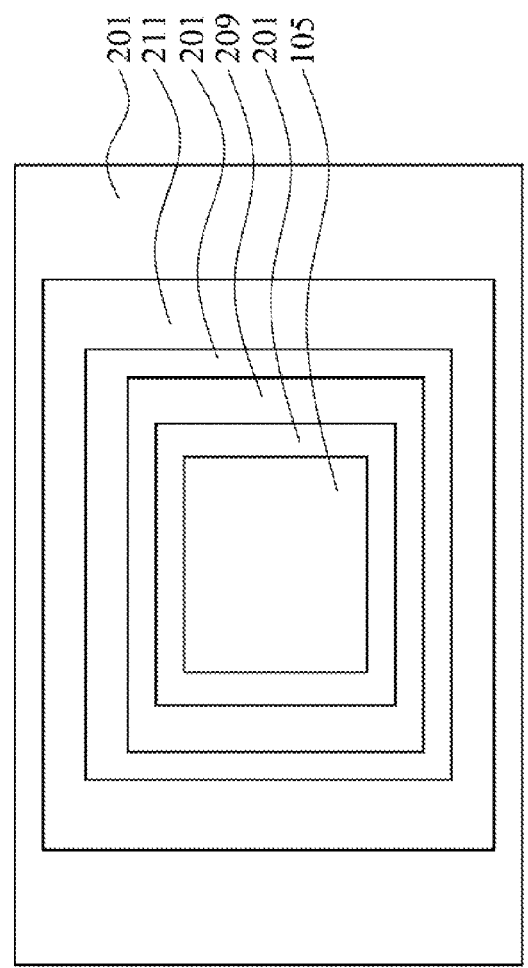
FIG. 2F is a top view of a packaging structure of an organic optoelectronic device during the manufacturing process according to another embodiment of the present disclosure.
Figure 2G:
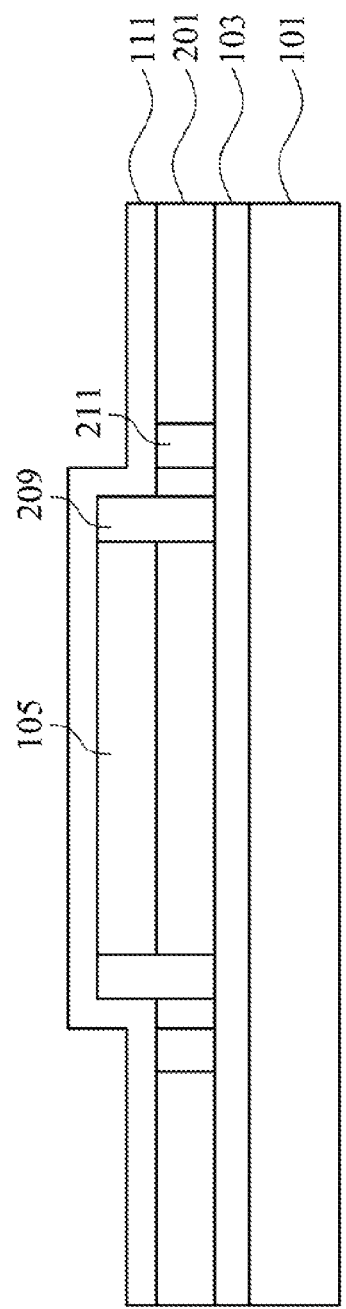
Figure 2H:
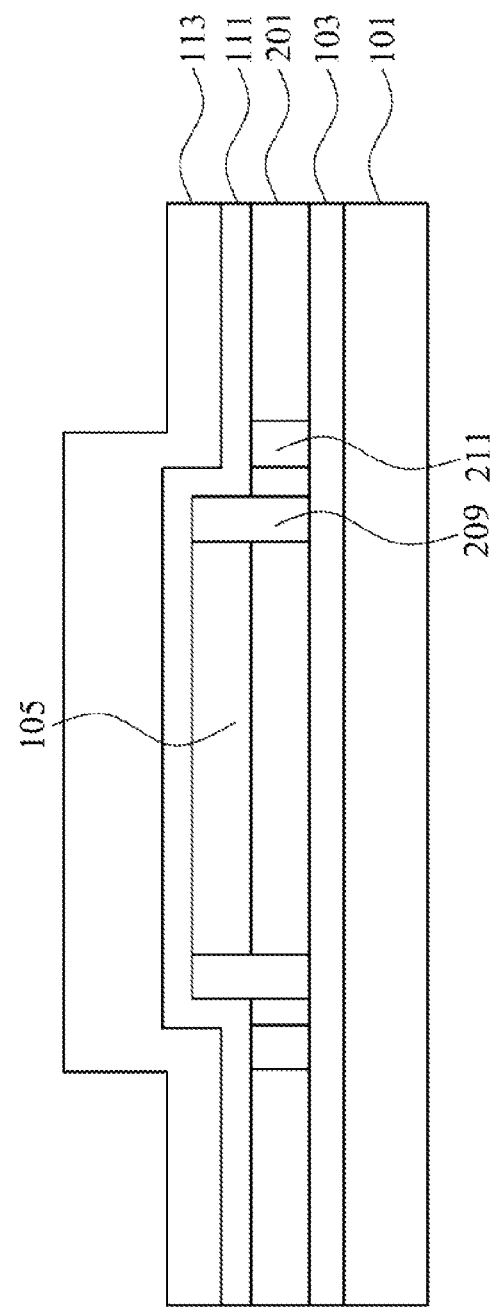

FIG. 2A to FIG. 2E and FIG. 2G to FIG. 2H are cross sectional diagrams of intermediate stages during a manufacturing process of a packaging structure of an organic optoelectronic device during the manufacturing process according to another embodiment of the present disclosure. Similar to the packaging structure shown in FIG. 1A to FIG. 1H, the first substrate 101, the organic optoelectronic device 105, the second barrier layer 111, and the second substrate 113 are the same as those depicted in FIG. 1A to FIG. 1H but the sealant is not filled in the recess on the first barrier layer 103 in this embodiment. Instead, a pattern defining layer 201 is formed on the first barrier layer 103, and a first through opening region 207 aligned to the first recess 107 (FIG. 2D) is defined on the pattern defining layer 201, in which the first through opening region 207 passes through the pattern defining layer 201 to expose a portion of the first barrier layer 103. The sealant 209 passes through the first through opening region 207 to attach the first barrier layer 103 to the second barrier layer 111 (shown in FIG. 2G and FIG. 2H). In addition to the first through opening region 207, a second through opening region 205 can be further defined on the pattern defining layer 201, in which the second through opening region 205 surrounds the first through opening region 207 and the organic optoelectronic device 105. The sealant 211 fills the second through opening region 205 to attach the second barrier layer 111 to the first barrier layer 103. The layers, from inner to outer in FIG. 2F, are the organic optoelectronic device 105, the pattern defining layer 201, the sealant 209, the pattern defining layer 201, the sealant 211, and the pattern defining layer 201. With two sealant layers, outside moisture and oxygen can be blocked from permeating into the package structure more thoroughly, and the organic optoelectronic device 105 can be protected even better.

After filling the sealant 209 and the sealant 211, the second barrier layer 111 and the second substrate 113 are subsequently disposed on the organic optoelectronic device 105, the sealant 209, and the sealant 211.

The packaging structure and the packaging method of the organic optoelectronic device in the above embodiments utilize the recesses and the sealants therein to surround the organic optoelectronic device and to block the moisture and oxygen, thus effectively preventing moisture and oxygen from entering the organic optoelectronic device, and preventing the organic optoelectronic device from being damaged. The number of the recesses and the sealants can be determined in accordance with actual needs, in which the more the recesses and the sealants are, the better the protection is.

In addition, the packaging structure is flexible and can effectively prevent the moisture and oxygen from entering the organic optoelectronic device for its edges/sides. Because the packaging structure is not easy to be damaged (cracked) by the moisture and the oxygen, it is suitable for use in a flexible organic optoelectronic device and a flexible display.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fail within the scope of the following claims.

What is claimed is:

1. A structure for packaging an organic optoelectronic device, the structure comprising:
   a first substrate;
   a first barrier layer disposed on the first substrate;
   an organic optoelectronic device disposed on the first barrier layer;
   a first recess forming a recessed closed loop on the first barrier layer to surround the organic optoelectronic device;
   a second barrier layer disposed on the organic optoelectronic device;
   a first sealant filling the first recess to attach the second barrier layer to the first barrier layer, wherein the sealant surrounds the organic optoelectronic device; and
   a pattern defining layer disposed on the first barrier layer, wherein the pattern defining layer comprises:
      a first through opening region corresponding to the first recess, and the first sealant passes through the first through opening region to attach the first barrier layer to the second barrier layer; and
      a second through opening region surrounding the first through opening region and the organic optoelectronic device, and a second sealant fills the second through opening region to attach the second barrier layer to the first barrier layer,
   wherein the first sealant and the second sealant are separated by the pattern defining layer.

2. The structure as claimed in claim 1, further comprising:
   a second substrate, wherein the second barrier layer is disposed on the second substrate and press-bonded onto the organic optoelectronic device.

3. The structure as claimed in claim 1, wherein the second barrier layer has a second recess aligned to the first recess, and the first sealant fills the first recess and the second recess.

4. The structure as claimed in claim 1, wherein the first substrate, the second substrate, the first barrier layer, and the second barrier layer are made of an organic material, an inorganic material, or an organic and inorganic composite material.

5. The structure as claimed in claim 1, wherein the first substrate and the second substrate are metal substrates, glass substrates, or flexible substrates.

6. The structure as claimed in claim 1, wherein the organic optoelectronic device is an organic thin film transistor or an organic light emitting diode.

7. The structure as claimed in claim 1, wherein the organic optoelectronic device is an internal device of an electronic paper display or a solar cell.

* * * * *